United States Patent
Ahn

(10) Patent No.: US 8,897,058 B2
(45) Date of Patent: Nov. 25, 2014

(54) NONVOLATILE MEMORY APPARATUS AND METHOD FOR DRIVING THE SAME

(71) Applicant: SK Hynix Inc., Icheon-si, Gyeonggi-do (KR)

(72) Inventor: Chang Yong Ahn, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/720,764

(22) Filed: Dec. 19, 2012

(65) Prior Publication Data

US 2014/0063896 A1    Mar. 6, 2014

(30) Foreign Application Priority Data

Aug. 30, 2012    (KR) .................. 10-2012-0095542

(51) Int. Cl.
*G11C 11/22* (2006.01)
*G11C 13/00* (2006.01)
*G11C 11/02* (2006.01)

(52) U.S. Cl.
CPC ........ *G11C 13/0064* (2013.01); *G11C 13/0002* (2013.01); *G11C 13/0004* (2013.01); *G11C 11/22* (2013.01); *G11C 11/02* (2013.01); *G11C 13/0069* (2013.01); *G11C 13/0061* (2013.01)
USPC ........... 365/145; 365/148; 365/158; 365/163; 365/189.16

(58) Field of Classification Search
CPC . G11C 13/00; G11C 13/0064; G11C 13/0069
USPC ...................... 365/145, 148, 158, 163, 189.16
See application file for complete search history.

(56) References Cited

U.S. PATENT DOCUMENTS

| | | | | |
|---|---|---|---|---|
| 6,928,022 | B2 * | 8/2005 | Cho et al. ................. | 365/225.7 |
| 6,967,865 | B2 * | 11/2005 | Lee ............................ | 365/163 |
| 7,242,605 | B2 * | 7/2007 | Choi et al. ................. | 365/148 |
| 7,639,522 | B2 * | 12/2009 | Cho et al. ................. | 365/148 |
| 7,751,233 | B2 * | 7/2010 | Kang et al. ............... | 365/163 |
| 8,228,720 | B2 * | 7/2012 | Choi et al. ................. | 365/163 |
| 2007/0183189 | A1 * | 8/2007 | Nirschl et al. ............. | 365/163 |
| 2009/0296450 | A1 * | 12/2009 | Sheu et al. ................ | 365/148 |
| 2009/0296458 | A1 * | 12/2009 | Lee et al. ................... | 365/163 |
| 2010/0061146 | A1 * | 3/2010 | Choi et al. ................. | 365/163 |
| 2010/0080040 | A1 * | 4/2010 | Choi ........................... | 365/148 |
| 2010/0103726 | A1 * | 4/2010 | Bae et al. .................. | 365/163 |
| 2010/0195370 | A1 * | 8/2010 | Shiimoto et al. .......... | 365/148 |
| 2010/0315870 | A1 * | 12/2010 | Abedifard .................. | 365/171 |
| 2011/0249491 | A1 * | 10/2011 | Abedifard et al. ......... | 365/171 |
| 2012/0170360 | A1 * | 7/2012 | Yoon .......................... | 365/163 |

FOREIGN PATENT DOCUMENTS

KR    10-2010-0035445 A    4/2010
KR    10-1069680 B1    9/2011

* cited by examiner

*Primary Examiner* — Fernando Hidalgo
(74) *Attorney, Agent, or Firm* — William Park & Associates Patent Ltd.

(57) ABSTRACT

A method for driving a nonvolatile memory apparatus includes: a data storage preparation step of setting a write control voltage to a first level of voltage; a data storage step of driving a driving transistor through the write control voltage to generate a write current, and storing an external data in a memory cell through the write current; a data detection step of varying the write control voltage by a predetermined level from a preset voltage level, and reading the data stored in the memory cell; and a data verification step of determining whether the stored data coincides with the external data or not, and repeating the data storage step and the data detection step according to a result of the determining.

19 Claims, 4 Drawing Sheets

NONVOLATILE MEMORY APPARATUS AND METHOD FOR DRIVING THE SAME

CROSS-REFERENCES TO RELATED APPLICATION

The present application claims priority under 35 U.S.C. §119(a) to Korean application number 10-2012-0095542 filed on Aug. 30, 2012 in the Korean Intellectual Property Office, which is incorporated herein by reference in its entirety.

BACKGROUND

1. Technical Field

The present invention generally relates to a nonvolatile memory apparatus, and more particularly, to a nonvolatile memory apparatus and a method for driving the same.

2. Related Art

In general, a semiconductor memory apparatus is classified into volatile memory apparatuses and nonvolatile memory apparatuses, depending on whether the memory apparatus can maintain data stored therein when power is cut off. The volatile memory apparatuses include random access memories such as SRAM and DRAM, and the nonvolatile memory apparatuses include read only memories and flash memories such as EEPROM.

Recently, a variety of memory apparatuses capable of storing data using a resistor have been proposed as an example of the nonvolatile memory apparatus. For example, a phase change RAM, a resistive RAM, a magnetic RAM and the like belong to the nonvolatile memory apparatuses. While a DRAM or flash memory stores data using electric charges, the nonvolatile memory apparatus using a resistor stores data using on phase change of a phase change material, resistance change of a variable resistor, and resistance change of a magnetic tunnel junction (MTJ) layer depending on the magnetization state of a ferromagnetic material.

Specifically, the phase change RAM stores data using a phase change material such as germanium-antimony-tellurium (GST; $Ge_2Sb_2Te_5$), which changes into a crystalline state or amorphous state while cooled down after being heated. Since a phase change material in a crystalline state has low resistance and a phase change material in an amorphous state has high resistance, the crystalline state may be defined as a set state or logic level 0, and the amorphous state may be defined as a reset state or logic level 1.

The phase change RAM provides a set pulse or reset pulse to a phase change material, and writes data using Joule heat generated by the set pulse or reset pulse. Specifically, the phase change material may be heated to a melting temperature or more using the reset pulse, and then rapidly quenched to change into the amorphous state. Alternatively, the phase change material may be heated to a temperature ranging from a crystallization temperature to a melting temperature using the set pulse, and then quenched to be changed into the crystalline state after the temperature is maintained during a predetermined time.

In order to prevent unnecessary current consumption, the nonvolatile memory apparatus using a resistor, including the phase change RAM, may adopt a write verify operation during a write operation. That is, when input data is to be written, data stored in a corresponding variable resistance memory cell (for example, a phase change memory cell in the case of the phase change RAM) is first read. Then, the read data and the input data to be written are compared to each other. Only when the two data are different from each other, the data is written into the corresponding memory cell. Such an operation is repeated until a desired level of data is stored in the memory cell.

However, when the write operation including a verification read operation is performed, the operation of reading stored data and the operation of writing data are separately performed. Therefore, the entire write operation time of the semiconductor memory apparatus inevitably increases.

SUMMARY

In an embodiment, a method for driving a nonvolatile memory apparatus includes: a data storage preparation step of setting a write control voltage to a first level of voltage; a data storage step of driving a driving transistor in response to the write control voltage to generate a write current, and storing an external data in a memory cell through the use of the write current; a data detection step of varying the write control voltage by a predetermined level from a preset voltage level, and reading the data stored in the memory cell; and a data verification step of determining whether the stored data coincides with the external data or not, and repeating the data storage step and the data detection step according to a result of whether the stored data coincides with the external data or not.

In an embodiment, there is provided a method for driving a nonvolatile memory apparatus, which repeats a write operation and a verification read operation during a data input operation, until external data and stored data coincide with each other, wherein the write operation includes the steps of: driving a driving transistor in response to a write control voltage to generate a write current; and storing the external data in a memory cell through the use of the write current, and the verification read operation includes the step of varying the write control voltage by a predetermined level from a preset voltage level, while detecting the data stored in the memory cell.

BRIEF DESCRIPTION OF THE DRAWINGS

Features, aspects, and embodiments are described in conjunction with the attached drawings, in which.

DETAILED DESCRIPTION

Hereinafter, a nonvolatile memory apparatus and a method for driving the same according to the present invention will be described below with reference to the accompanying drawings through various embodiments.

Figure 1:
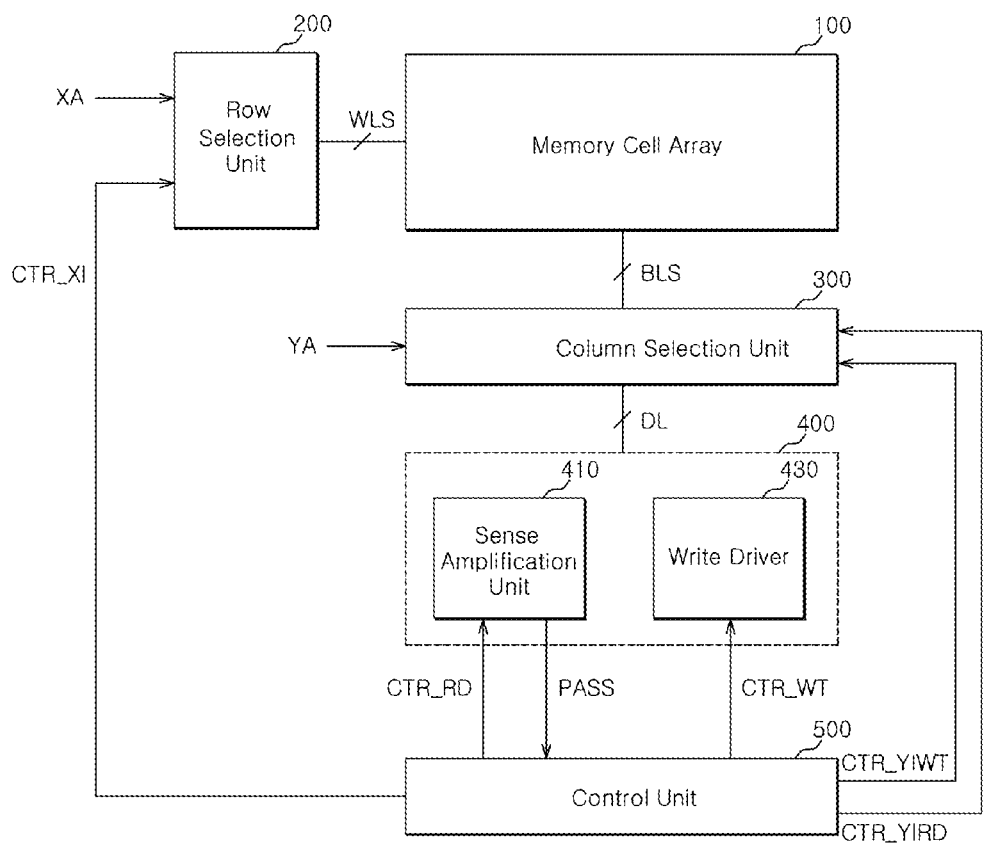
FIG. 1 is a block diagram illustrating a nonvolatile memory apparatus according to an embodiment.

FIG. 1 is a block diagram illustrating a nonvolatile memory apparatus according to an embodiment.

Referring to FIG. 1, the nonvolatile memory apparatus according to an embodiment may include a memory cell array 100, a row selection unit 200, a column selection unit 300, a read write block 400, and a control unit 500.

The memory cell array 100 may include a plurality of memory cells (not illustrated) to store data. The plurality of memory cells are arranged at the respective intersections between a plurality of word lines WLs and a plurality of bit lines BLs.

The row selection unit 200 may operate according to a row select control signal CTR_XI applied from the control unit 500. The row selection unit 200 may be connected to the memory cell array 100 through the word lines WLS. The row selection unit 200 may be configured to decode a row address XA inputted when the row select control signal CTR_XI is activated, and activate a corresponding word line. That is, the row selection unit 200 may provide different bias voltages to a selected word line and an unselected word line according to the decoding result.

The column selection unit 300 may operate according to a write column select control signal CTR_YIWT and a read column select control signal CTR_YIRD which are applied from the control unit 500. The column selection unit 300 may be connected to the memory cell array 100 through the bit lines BLS. The column selection unit 300 may be configured to decode a column address YA inputted when the write column select control signal CTR_YIWT or the read column select control signal CTR_YIRD is activated, and activate a corresponding bit line. Although described below, the column selection unit 300 may connect the selected bit line to a write driver 430 or connect the selected bit line to a sense amplification unit 410, according to the decoding result.

The data read write block 400 may operate according to a read control signal CTR_RD and a write control voltage CTR_WT which are applied from the control unit 500. Specifically, the data read write block 400 may include the sense amplification unit 410 and the write driver 430. The write driver 430 may be configured to write data into a selected memory cell of the memory cell array 100 according to the write control voltage CTR_WT during a write operation. At this time, a write current (not illustrated) corresponding to the level of the write control voltage CTR_WT may be generated, and data may be written into the memory cell by the write current. The sense amplification unit 410 may be configured to read data stored in a selected memory cell during a read operation. Additionally, column selection unit 300 is coupled to the data read write block 400 through a data line DL.

At this time, the operation of writing input data into the corresponding memory cell may be performed through a write operation and a verification read operation which may be repeated many times. Additionally, suppose that one write operation and one verification read operation are set to one write loop. Such a write loop may be repeated many times until the read data is equalized to the input data during the verification read operation.

The control unit 500 may control the level of the write control voltage CTR_WT to increase (or decrease) whenever the write loop is repeated, such that the write current is increased in a stepwise manner. Additionally, the level of the write control voltage CTR_WT may be set to increase (or decrease) during each verification read operation, until the read data is equalized to the input data during the verification read operation.

The sense amplifier 410 may be configured to output an activated pass signal PASS to the control unit 500 when the read data is equal to the input data during the verification read operation. When the pass signal PASS is activated, it means that the corresponding memory cell was written at a desired level. The control unit 500 ends the repeated write loop, and then terminates the entire operation.

The control unit 500 may be configured to control overall operations of the nonvolatile memory apparatus in response to a command provided from an external device. For example, the control unit 500 may control a write read operation or the like of the nonvolatile memory apparatus as described above.

Specifically, when input data is to be written into the corresponding memory cell, the control unit 500 first activates the read control signal CTR_RD. Then, the sense amplification unit 410 may read data stored in the corresponding memory cell, compare the read data to the input data, and then output a pass signal PASS to the control unit 500.

When the deactivated pass signal PASS is applied, the control unit 500 may apply the write control voltage CTR_WT and the write column select control signal CTR_YIWT to write data, and then may apply the read control signal CTR_RD and the read column select control signal CTR_YIRD to read data. Such a write loop may be repeated until the activated pass signal PASS is outputted. Additionally, whenever the write loop is repeated, the level of the write control voltage CTR_WT may be set to increase (or decrease) in a stepwise manner during the verification read operation, such that the write current is increased in a stepwise manner. Accordingly, since the next write operation can be prepared during the verification read operation, the entire write operation time may be reduced.

Figure 2:
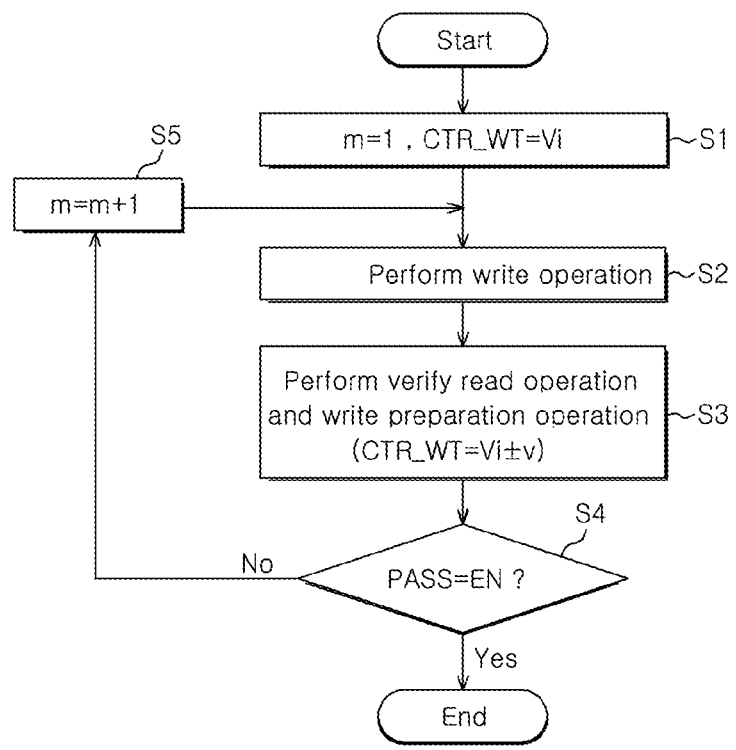
FIG. 2 is a flow chart for explaining a method for driving the nonvolatile memory apparatus illustrated in FIG. 1.

FIG. 2 is a flow chart for explaining a method for driving the nonvolatile memory apparatus illustrated in FIG. 1. The flow chart shows a driving method which may be performed when data stored in a memory cell is different from input data which is to be written into the memory cell.

In FIG. 2, m represents how many write loops it is. For example, when m is 1 (i.e., m=1), m represents a first write loop, and when m is 2, m represents a second write loop.

Referring to FIGS. 1 and 2, the write control voltage CTR_WT is set to have a first level Vi (i.e., voltage level) when m=1, that is, during the first write loop, at step S1 (i.e., m=1, CTR_WT=Vi).

Then, the write driver 430 may be driven in response to the write control voltage CTR_WT to perform a write operation on a corresponding memory cell at step S2 (i.e., Perform write operation).

When the write operation is ended, the sense amplification unit 410 may perform a verification read operation on the data written into the corresponding memory cell. Additionally, when the sense amplification unit 410 performs the verification read operation, the control unit 500 increases (or decreases) the write control voltage CTR_WT by a predetermined level, in order to prepare the next write operation, at step S3 (i.e., Perform verification read operation and write preparation operation (CTR_WT=Vi±v)) (i.e., where v is voltage). The reason to change the level of the write control voltage CTR_WT is in order to increase a write current for performing the next write operation. Therefore, depending on the settings, the write control voltage CTR_WT may be designed to be increased or decreased in a direction where the write current is increased.

When the verification read operation is ended, whether or not the read data is equal to the input data is determined to output the pass signal PASS to the control unit 500 at step S4 (i.e., PASS=EN) (i.e., where EN is an activated pass signal PASS).

The control unit 500 may end the entire operation when the pass signal PASS is activated (i.e., PASS=EN), and may control a second write loop to be performed when the pass signal PASS is deactivated, at step S5 (i.e., m=m+1).

As such, the nonvolatile memory apparatus according to an embodiment may repeat the write loop until the input data is written into the memory cell. At this time, since the next write operation can be prepared while the verification read operation is performed, the entire write operation time may be reduced.

Figure 3:
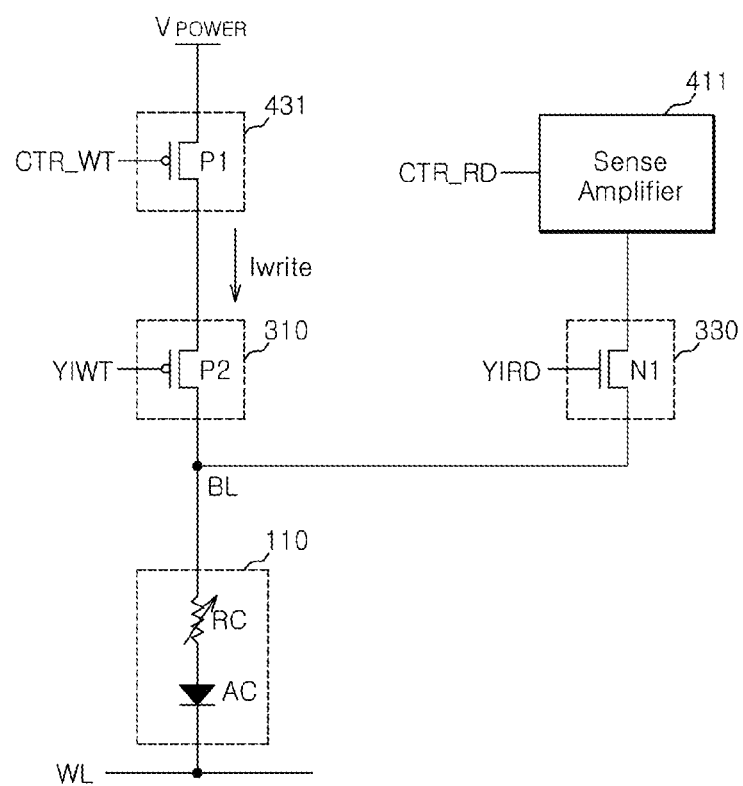
FIG. 3 is a circuit diagram for explaining the method for driving the nonvolatile memory apparatus illustrated in FIG. 1 in more detail.

FIG. 3 is a circuit diagram for explaining the method for driving the nonvolatile memory apparatus illustrated in FIG. 1 in more detail.

The nonvolatile memory apparatus illustrated in FIG. 3 may include a memory cell 110, a write column select transistor 310, a driving transistor 431, a read column select transistor 330, and a sense amplifier 411.

The nonvolatile memory apparatus illustrated in FIG. 3 may include a phase change memory apparatus. However, the nonvolatile memory apparatus according to an embodiment is not limited to a phase change memory apparatus. The nonvolatile memory apparatus may be configured as one of nonvolatile memory apparatuses such as a NAND flash memory apparatus, a NOR flash memory apparatus, a ferroelectric RAM using a ferroelectric capacitor, and a magnetic RAM using a tunneling magneto-resistive (TMR) layer.

The memory cell 110 of FIG. 3 according to an embodiment is implemented with a phase change memory cell. The memory cell may include a memory element RC and a selecting element AC.

The memory element RC has a variable resistance value according to an applied current. Specifically, the memory element RC may be formed of a phase change material GST. The memory element RC may include a top electrode connected to a bit line BL and a bottom electrode connected to the selecting element AC.

The phase of the phase change material GST changes according to the magnitude of a supplied current and the time during which the current is supplied. The phase of the phase change material GST corresponding to the reset state or set state is decided by an amorphous volume. As the phase change material GST changes from the amorphous state to the crystalline state, the amorphous volume decreases. The amorphous state corresponds to the reset state, and the crystalline state corresponds to the set state.

The phase change material has a variable resistance value according to the amorphous volume. That is, data to be written is decided by the amorphous volume of the phase change material, which is formed according to an applied write current Iwrite.

The selecting element AC may include a diode. The diode has an anode connected to the memory element RC and a cathode connected to a word line WL. When a ground voltage is applied to the word line WL to select the memory cell 110, a voltage difference between the anode and cathode of the diode is changed. When the voltage difference between the anode and cathode of the diode becomes higher than the threshold voltage of the diode, the diode is turned on. When the diode is turned on, the memory element RC receives a current through the bit line BL.

The write column select transistor 310 may be included in the column selection unit 300 (see FIG. 1), and may connect the driving transistor 431 and the bit line BL in response to a write column select signal YIWT. The write column select signal YIWT may be generated by decoding a column address YA when the activated write column select control signal CTR_YIWT is applied from the control unit 500. That is, the write column select signal YIWT is activated when data is written into the memory cell 110 connected to the corresponding bit line BL. Specifically, the write column select transistor 310 may be implemented with a PMOS transistor P2, and thus the write column select signal YIWT may be set to be activated to a low level.

The driving transistor 431 may be included in the write driver 430 (see FIG. 1), and may drive a write current Iwrite from a power supply voltage Vpower in response to the write control voltage CTR_WT. At this time, since the level of the write control voltage CTR_WT may be set to increase (or decrease) in a stepwise manner whenever the write loop is repeated, the write current Iwrite may increase in a stepwise manner. The level of the write control voltage CTR_WT may be set to increase (or decrease) in a stepwise manner during each verification read operation, until the read data is equalized to the input data during the verification read operation. Specifically, the driving transistor 431 may be implemented with a PMOS transistor P1, and thus the level of the write control voltage CTR_WT may be set to decrease in a stepwise manner.

The read column select transistor 330 may be included in the column selection unit 300 (see FIG. 1), and connects the sense amplifier 411 and the bit line BL in response to a read column select signal YIRD. The read column select signal YIRD may be generated by decoding the column address YA when the activated read column select control signal CTR_YIRD is applied from the control unit 500. That is, the read column select signal YIRD is activated when the data written into the memory cell 110 connected to the corresponding bit line BL is read. Specifically, the read column select transistor 330 may be implemented with an NMOS transistor N1, and thus the read column select signal CTR_YIWT may be set to be activated to a high level.

The sense amplifier 411 may perform an operation of sensing the data of the memory cell in response to the read control signal CTR_RD activated during the verification read operation. The sense amplifier 411 may sense the data loaded in the memory cell 110, when the read column select transistor 330 is turned on.

Figure 4:
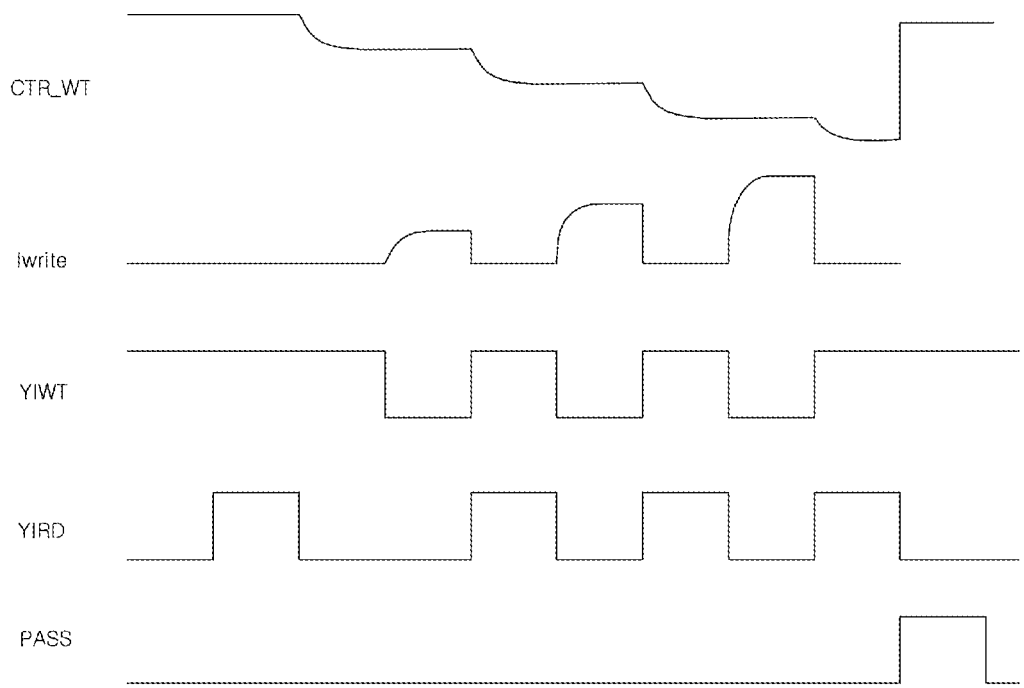
FIG. 4 is a timing diagram for explaining the operation of the nonvolatile memory apparatus illustrated in FIGS. 1 and 3.

FIG. 4 is a timing diagram for explaining the operation of the nonvolatile memory apparatus illustrated in FIGS. 1 and 3.

In order to write input data into the nonvolatile memory apparatus, an activated read column select signal pulse YIRD may be first applied. The pass signal PASS may continuously maintain a deactivated state. This means that data stored in a corresponding memory cell has a different level from the input data to be written. Therefore, the nonvolatile memory apparatus according to an embodiment may repeat a write loop including a write operation and a verification read operation, until the input data is written into the corresponding memory cell.

First, the write control voltage CTR_WT may be decreased by a predetermined level to prepare the driving transistor 431 to be driven.

Then, in order to perform a write operation, an activated write column select signal pulse YIWT is applied to generate a predetermined write current (write. Then, in order to perform a verification read operation, an activated read column select signal pulse YIRD is applied to read written data. When the verification read operation is performed, the write control voltage CTR_WT is decreased by a predetermined level to prepare the next write operation. Since the pass signal PASS continuously maintains a deactivated state, the write loop is repeated. Such a write loop is repeated until the read data is equalized to the input data. That is, the write loop is repeated until the pass signal PASS is activated (i.e., Read, Prepare, First write, Read, Prepare, Second write, Read, Prepare, Third write, Read Prepare). When the pass signal PASS is activated, the operation of writing input data into the corresponding memory cell is ended.

While various embodiments have been described above, it will be understood to those skilled in the art that the embodiments described are by way of example only. Accordingly, the nonvolatile memory apparatus described herein should not be limited based on the described embodiments.

What is claimed is:

1. A method for driving a nonvolatile memory apparatus which comprises a control unit and a write driver, comprising:
   a data storage preparation step of setting a write control voltage generated by the control unit to a first level of voltage;
   a data storage step of driving a driving transistor included in the write driver in response to the write control voltage to generate a write current, and storing an external data in a memory cell through the use of the write current;
   a data detection step of changing the write control voltage by a predetermined level from a preset voltage level, when reading the data stored in the memory cell; and
   a data verification step of determining whether the stored data coincides with the external data or not, and repeating the data storage step and the data detection step according to a result of whether the stored data coincides with the external data or not,
   wherein a level of the write control voltage is changed by the control unit.

2. The method according to claim 1, wherein, in the data detection step,
   when the voltage level of the write control voltage is increased by a determined level, the write current is increased at the data storage step.

3. The method according to claim 1, wherein, in the data detection step,
   when the voltage level of the write control voltage is decreased by a predetermined level, the write current is increased at the data storage step.

4. The method according to claim 1, wherein, in the data detection step comprises,
   disconnecting the driving transistor and the memory cell.

5. The method according to claim 1, wherein, in the data verification step,
   when the stored data does not coincide with the external data, the data storage step, data detection step, and data verification step are all performed again.

6. The method according to claim 1, wherein when the stored data coincides with the external data, the operation of the data verification step is ended.

7. The method according to claim 1, wherein the memory cell comprises a resistive memory cell.

8. The method according to claim 1, wherein the nonvolatile memory apparatus comprises a phase change random access memory.

9. The method according to claim 1, wherein the nonvolatile memory apparatus comprises a ferroelectric random access memory.

10. The method according to claim 1, wherein the nonvolatile memory apparatus comprises a magnetic random access memory.

11. A method for driving a nonvolatile memory apparatus including a control unit and a write driver, which repeats a write operation and a verification read operation during a data input operation, until external data and stored data coincide with each other,
    wherein the write operation comprises the steps of:
    driving a driving transistor included in the write driver in response to a write control voltage generated by the control unit to generate a write current; and
    storing the external data in a memory cell through the use of the write current, and
    the verification read operation comprises the step of changing the write control voltage by a predetermined level from a preset voltage level, when detecting the data stored in the memory cell, in order for next write operation,
    wherein a level of the write control voltage is changed by the control unit.

12. The method according to claim 11, wherein when the voltage level of the write control voltage is increased by a predetermined level during the verification read operation, the write current increased during the write operation.

13. The method according to claim 11, wherein when the voltage level of the write control voltage is decreased by a predetermined level during the verification read operation, the write current is increased during the write operation.

14. The method according to claim 11, wherein while the level of the write control voltage is changed during the verification read operation, the driving transistor and the memory cell are disconnected.

15. The method according to claim 11, wherein the write operation and the verification read operation are repeated until the stored data coincides with the external data.

16. The method according to claim 11, wherein the memory cell comprises a resistive memory cell.

17. The method according to claim 11, wherein the nonvolatile memory apparatus comprises a phase change random access memory.

18. The method according to claim 11, wherein the nonvolatile memory apparatus comprises a ferroelectric random access memory.

19. The method according to claim 11, wherein the nonvolatile memory apparatus comprises a magnetic random access memory.

* * * * *